(12) United States Patent
Kim et al.

(10) Patent No.: US 9,093,132 B2
(45) Date of Patent: Jul. 28, 2015

(54) NONVOLATILE MEMORY DEVICE, MEMORY SYSTEM AND CONTROLLER OPERATING METHOD

(75) Inventors: Soon-Young Kim, Hwaseong-si (KR); Seijin Kim, Seongnam-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 477 days.

(21) Appl. No.: 13/562,373

(22) Filed: Jul. 31, 2012

(65) Prior Publication Data
US 2013/0128675 A1   May 23, 2013

(30) Foreign Application Priority Data
Nov. 21, 2011   (KR) .................. 10-2011-0121719

(51) Int. Cl.
*G11C 7/10* (2006.01)

(52) U.S. Cl.
CPC ............... *G11C 7/10* (2013.01); *G11C 7/1063* (2013.01)

(58) Field of Classification Search
CPC ............................... G11C 7/10; G11C 7/1063
USPC ............ 365/189.05, 189.02, 185.22, 189.011
See application file for complete search history.

(56) References Cited

U.S. PATENT DOCUMENTS

| | | |
|---|---|---|
| 5,822,244 A | 10/1998 | Hansen et al. |
| 6,412,041 B1 | 6/2002 | Lee |
| 6,930,925 B2 | 8/2005 | Guo et al. |
| 7,032,081 B1 | 4/2006 | Gefen et al. |
| 2007/0081398 A1* | 4/2007 | Kotani et al. ............ 365/189.02 |

FOREIGN PATENT DOCUMENTS

KR   102000003371 A   6/2000

* cited by examiner

*Primary Examiner* — Richard Elms
*Assistant Examiner* — Mohammed A Bashar
(74) *Attorney, Agent, or Firm* — Volentine & Whitt, PLLC

(57) ABSTRACT

An operating method for a memory system provides a ready/busy signal from a nonvolatile memory device indicating an idle state or a busy state to a controller. The controller generates a next command but transfers the next command to the nonvolatile memory device in response to the ready/busy signal and the idle verse busy state of a target plane among multiple planes of the nonvolatile memory device.

19 Claims, 19 Drawing Sheets

Fig. 4A

|  | R/nB |
|---|---|
| Planes idle | Idle |
| Plane1 busy | Idle |
| Plane2 busy | Idle |
| Planes busy | Busy |

Fig. 4B

|  | R/nB |
|---|---|
| Planes idle | Idle |
| Plane1 busy | Busy |
| Plane2 busy | Busy |
| Planes busy | Busy |

Fig. 4C

|  | R/nB |
|---|---|
| Planes idle | Idle |
| Plane1 busy | Waveform1 |
| Plane2 busy | Waveform2 |
| Planes busy | Busy |

Fig. 12

|  | R/nB1 | R/nB2 |
|---|---|---|
| Planes idle | Idle | Idle |
| Plane1 busy | Busy | Idle |
| Plane2 busy | Idle | Busy |
| Planes busy | Busy | Busy |

NONVOLATILE MEMORY DEVICE, MEMORY SYSTEM AND CONTROLLER OPERATING METHOD

CROSS-REFERENCE TO RELATED APPLICATIONS

This application claims the benefits, under 35 U.S.C §119, of Korean Patent Application No. 10-2011-0121719 filed Nov. 21, 2011, the subject matter of which is hereby incorporated by reference.

BACKGROUND

The inventive concept relates to semiconductor memory devices, and more particularly, to nonvolatile memory devices, controllers that control nonvolatile memory devices, and operating methods for such controllers.

A semiconductor memory device is a memory device which is fabricated using semiconductors such as silicon (Si), germanium (Ge), gallium arsenide (GaAs), indium phosphide (InP), and the like. Semiconductor memory devices are classified into volatile memory devices and nonvolatile memory devices.

The volatile memory devices may lose stored contents at power-off. The volatile memory devices include a static RAM (SRAM), a dynamic RAM (DRAM), a synchronous DRAM (SDRAM), and the like. The nonvolatile memory devices may retain stored contents even at power-off. The nonvolatile memory devices include a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), and the like. The flash memory device is roughly divided into a NOR type and a NAND type.

SUMMARY

In one embodiment, the inventive concept is directed to a nonvolatile memory device, comprising; a first plane configured to perform a first operation directed to a first memory cell array in response to a first command received from a controller, a second plane configured to perform a second operation directed to a second memory cell array physically separate from the first memory cell array in response to a second command received from the controller, and a data input/output (I/O) circuit that transfers read data to the controller via a common data bus obtained from at least one of the first memory cell array and the second memory cell array in response to a read command, that transfers program data received from the controller via the common data bus to at least one of the first memory cell array and the second memory cell array in response to a program command, and that provides a ready/busy signal indicating one of an idle state and a busy state, wherein the state of the ready/busy signal determines whether the first command and the second command are executed.

In another embodiment, the inventive concept is directed to an operating method for a controller that controls a nonvolatile memory device including a plurality of planes, each plane being respectively and independently configured to perform an operation relative to other planes in the plurality of planes, the operating method comprising; generating a next command directed to a target plane among the plurality of planes, performing a status read operation to determine whether the target plane is in an idle state or a busy state, if the target state is in the idle state, transferrin the next command to the nonvolatile memory device for execution, and if the target state is in the busy state determining a priority for the next command.

In another embodiment, the inventive concept is directed to an operating method for a memory system including a controller and a nonvolatile memory device including first and second planes being respectively and independently configured to perform an operation relative, the operating method comprising; providing a ready/busy signal from the nonvolatile memory device indicating one of an idle state and a busy state for the nonvolatile memory device, in the controller, generating a next command indicating a first operation directed to the first plane; and then, if the ready/busy indicates the idle state, performing a status read operation to determine whether the first plane is in the idle state, and if the first plane is in the idle state immediately transferring the next command to the nonvolatile memory device, otherwise waiting to transfer the next command to the nonvolatile memory.

In another embodiment, the inventive concept is directed to a memory system comprising; a controller and a nonvolatile memory device controlled in its operation by the controller, wherein the nonvolatile memory comprises; a first plane configured to perform a first operation directed to a first memory cell array in response to a first command received from the controller, a second plane configured to perform a second operation directed to a second memory cell array physically separate from the first memory cell array in response to a second command received from the controller; and a data input/output (I/O) circuit that transfers read data to the controller via a common data bus obtained from at least one of the first memory cell array and the second memory cell array in response to a read command, that transfers program data received from the controller via the common data bus to at least one of the first memory cell array and the second memory cell array in response to a program command, and that provides a ready/busy signal indicating one of an idle state and a busy state, wherein the state of the ready/busy signal determines whether the first command and the second command are executed.

BRIEF DESCRIPTION OF THE FIGURES

The above and other objects and features will become apparent from the following description with reference to the following figures, wherein

FIGS. 4A through 4C are tables illustrating examples of a ready/busy signal R/nB output from a data input/output circuit in FIG. 1.

FIG. 12 is a table illustrating ready/busy signals according to states of first and second planes.

DETAILED DESCRIPTION

Figure 1:
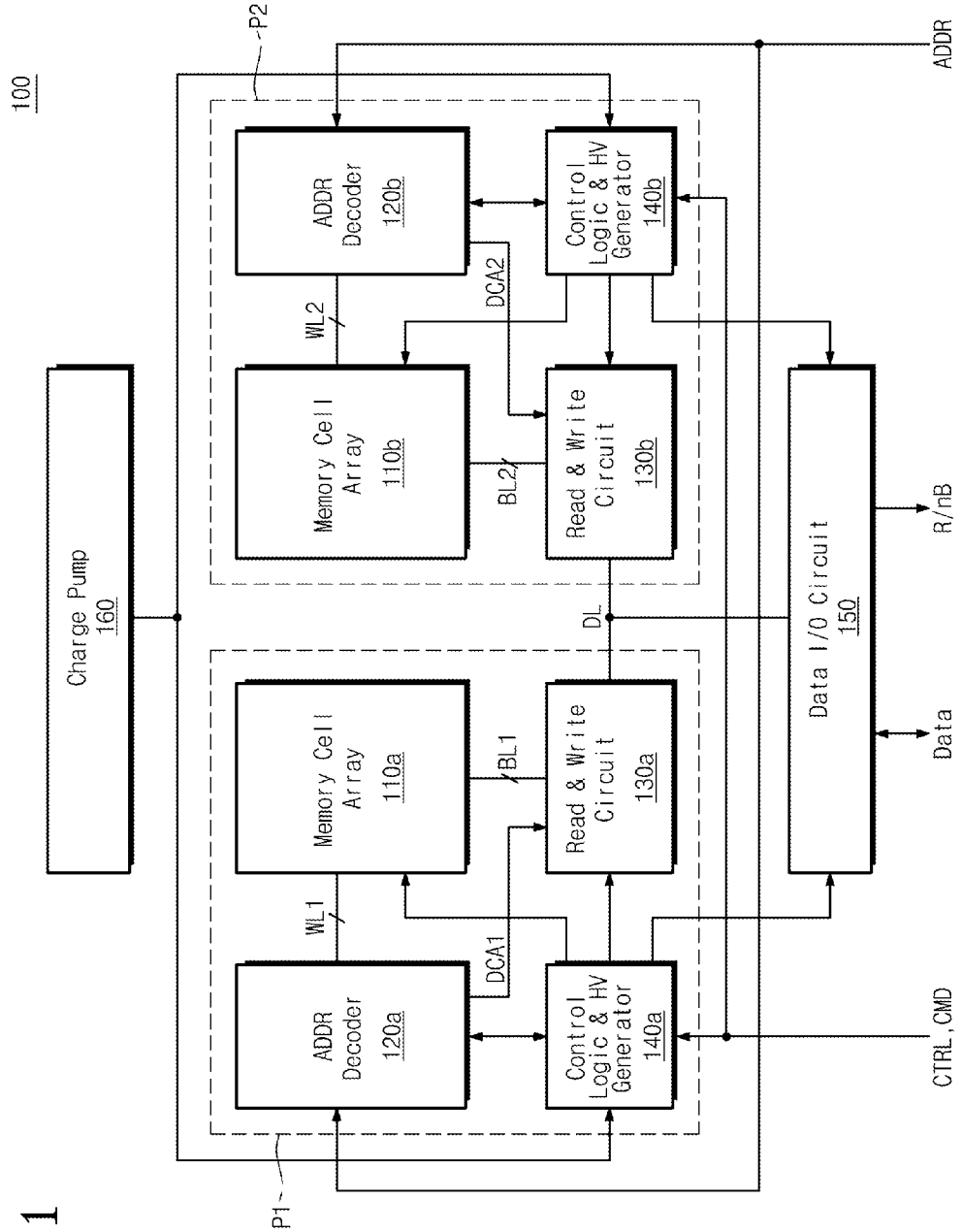
FIG. 1 is a block diagram schematically illustrating a nonvolatile memory device according to an embodiment of the inventive concept.

Certain embodiments of the inventive concept will now be described in some additional detail with reference to the accompanying drawings. The inventive concept may, however, be embodied in many different forms and should not be construed as being limited to only the illustrated embodiments. Rather, these embodiments are provided so that this disclosure will be thorough and complete, and will fully convey the scope of the inventive concept to those skilled in the art. Throughout the written description and drawings, like reference numbers and labels are used to denote like or similar elements.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

In the illustrated embodiments, the inventive concept is described in the context of NAND flash memory devices. However, the inventive concept is not limited to only NAND flash memory. Rather, the inventive concept may be applied to an Electrically Erasable and Programmable ROM (EEPROM), a NOR flash memory device, a Phase-change RAM (PRAM), a Magnetic RAM (MRAM), a Resistive RAM (RRAM), a Ferroelectric RAM (FRAM), and the like.

Figure (FIG.) 1 is a block diagram schematically illustrating a nonvolatile memory device according to an embodiment of the inventive concept. Referring to FIG. 1, a nonvolatile memory device 100 may include a first plane P1, a second plane P2, a data input/output (I/O) circuit 150, and a charge pump 160. The first plane P1 may include a memory cell array 110a, an address decoder 120a, a read/write circuit 130a, and control logic and high voltage generator 140a. The second plane P2 may include a memory cell array 110b, an address decoder 120b, a read/write circuit 130b, and control logic and high voltage generator 140b. The first and second planes P1 and P2 may have the same structure.

The memory cell array 110a/110b may be connected to the address decoder 120a/120b via word lines WL1/WL2 and to the read and write circuit 130a/130b via bit lines BL1/BL2. The memory cell array 110a/110b may include a plurality of nonvolatile memory cells, including single level memory cells (SLC) and/or multi-level memory cells (MLC). In the illustrated embodiments, memory cells arranged in a row direction may be connected to the word lines WL1/WL2, and memory cells arranged in a column direction may be connected to the bit lines BL1/BL2. For example, memory cells arranged in a column direction may form a plurality of cell groups (e.g., strings). The plurality of cell groups may be connected to the bit lines BL1/BL2, respectively. In the illustrated embodiments, the memory cell array 110a/110b may be formed of a plurality of memory cells each storing one or more bits of data.

The address decoder 120a/120b may be connected to the memory cell array 110a/110b via the word lines WL1/WL2. The address decoder 120a/120b may be configured to operate responsive to the control of the control logic and high voltage generator 140a/140b. The address decoder 120a/120b may receive an address ADDR from the outside. The address decoder 120a of the first plane P1 and the address decoder 120b of the second plane P2 may receive the address ADDR via the same bus.

The address decoder 120a/120b may be configured to decode a row address of the input address ADDR. Using the decoded row address, the address decoder 120a/120b may select the word lines WL1/WL2. The address decoder 120a/120b may be configured to decode a column address of the input address ADDR. The decoded column address DCA1/DCA2 may be sent to the read and write circuit 130a/130b. In the illustrated embodiments, the address decoder 120a/120b may include constituent elements such as a row decoder, a column decoder, an address buffer, and the like.

The read and write circuit 130a/130b may be connected to the memory cell array 110a/110b via the bit lines BL1/BL2 and to the data I/O circuit 150 via data lines DL. The read and write circuit 130a of the first plane P1 and the read and write circuit 130b of the second plane P2 may be connected to the data input/output circuit 150 via the data line DL.

The read and write circuit 130a/130b may operate responsive to the control of the control logic and high voltage generator 140a/140b. The read and write circuit 130a/130b may be configured to receive the decoded column address DCA1/DCA2 from the address decoder 120a/120b. Using the decoded column address DCA1/DCA2, the read and write circuit 130a/130b may select the bit lines BL1/BL2.

In the illustrated embodiments, the read and write circuit 130a/130b may receive data from the data I/O circuit 150 to write the input data in the memory cell array 110a/110b. The read and write circuit 130a/130b may read data from the memory cell array 110a/110b to transfer it to the data I/O circuit 150. The read and write circuit 130a/130b may read data from a first storage region of the memory cell array 110a/110b to write it in a second storage region of the memory cell array 110a/110b. For example, the read and write circuit 130a/130b may be configured to perform a copy-back operation.

In the illustrated embodiments, the read and write circuit 130a/130b may include constituent elements such as a page buffer (or, a page register), a column selector, and the like. In other example embodiments, the read and write circuit 130a/130b may include constituent elements such as a sense amplifier, a write driver, a column selector, and the like.

The control logic and high voltage generator 140a/140b may be connected to the address decoder 120a/120b, the read and write circuit 130a/130b, and the data I/O circuit 150. The control logic and high voltage generator 140a/140b may receive a high voltage VPP from the charge pump 160. The control logic and high voltage generator 140a/140b may generate various voltages required for programming, reading, or erasing of the first/second plane P1/P2 using the high voltage VPP. The control logic and high voltage generator 140a/140b may provide the voltages to the address decoder 120a/120b, the read and write circuit 130a/130b, or the memory cell array 110a/110b.

The control logic and high voltage generator 140a/140b may receive an externally provided control signal CTRL and an externally provided command CMD. The control logic and high voltage generator 140a of the first plane P1 and the control logic and high voltage generator 140b of the second plane P2 may receive the control signal CTRL and the command via a common bus.

The control logic and high voltage generator 140a/140b may operate responsive to the control signal CTRL. The control logic and high voltage generator 140a/140b may decode the input command CMD, and may operate according to the decoded command. For example, the control logic and high voltage generator 140a/140b may control the address decoder 120a/120b and the read and write circuit 130a/130b so as to perform a program operation, a read operation, and/or an erase operation.

The data I/O circuit 150 may be connected to the read and write circuits 130a and 130b via the data lines DL. The data I/O circuit 150 may be connected to the read and write circuit 130a of the first plane P1 and the read and write circuit 130b of the second plane P2 via the common data lines DL.

The data I/O circuit 150 may operate responsive to the control of the control logic and high voltage generators 140a and 140b. The data I/O circuit 150 may be configured to exchange data with the outside. The data I/O circuit 150 may be configured to transfer data provided from the outside to the read and write circuit 130a/130b via the data lines DL. The data I/O circuit 150 may be configured to output data transferred via the data lines DL via the read and write circuit 130a/130b to the outside. In the illustrated embodiments, the data I/O circuit 150 may include a constituent element such as a data buffer.

The charge pump 160 may be configured to generate the high voltage (HV) signal (e.g., VPP). The charge pump 160 may provide the high voltage VPP to the control logic and high voltage generator 140a of the first plane P1 and the control logic and high voltage generator 140b of the second plane P2.

Figure 2:
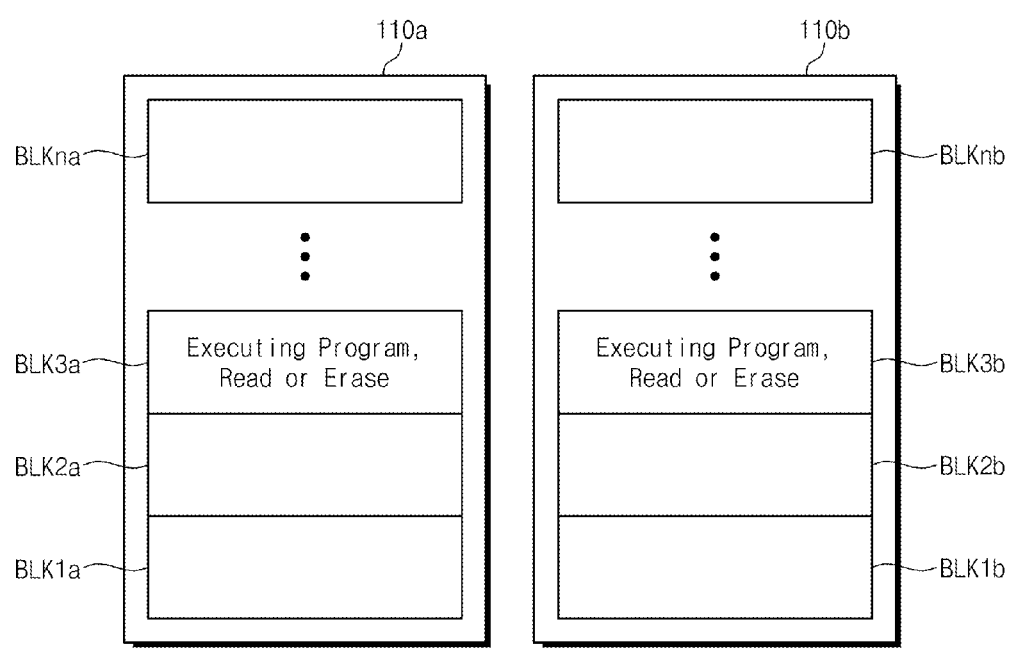
FIG. 2 is a diagram describing an example of programming, reading, or erasing executed at a memory cell array of a first plane and a memory cell array of a second plane.

FIG. 2 further illustrates the memory cell arrays 110a and 110b to conceptually describe examples of program, read, and/or erase operations as executed according to a memory cell array of a first plane and the memory cell array of a second plane. Referring to FIGS. 1 and 2, the memory cell array 110a is assumed to include a plurality of memory blocks BLK1a through BLKna, and the memory cell array 110b is assumed to include a plurality of memory blocks BLK1b through BLKnb.

Programming, reading, and/or erasing of the memory cell arrays 110a and 110b may be performed independently. For example, when programming, reading, or erasing is executed at a memory block BLK3a of the memory cell array 110a, programming, reading, or erasing may be executed at a memory block BLK3b of the memory cell array 110b. When programming of the memory block BLK3a is performed, programming, reading, or erasing can be performed at the memory block BLK3b. Programming, reading, or erasing of the first and second planes P1 and P2 may be performed independently.

Independent programming, reading, or erasing of the memory cell arrays 110a and 110b is not limited to memory blocks that are located in similar positions within the memory cell arrays. For example, when programming, reading, or erasing is performed on a memory block BLK3a of the memory cell array 110a, a memory block (e.g., BLK1b) of the memory cell array 110b placed at a position different from the memory block BLK3a can be programmed, read, or erased.

Figure 3:
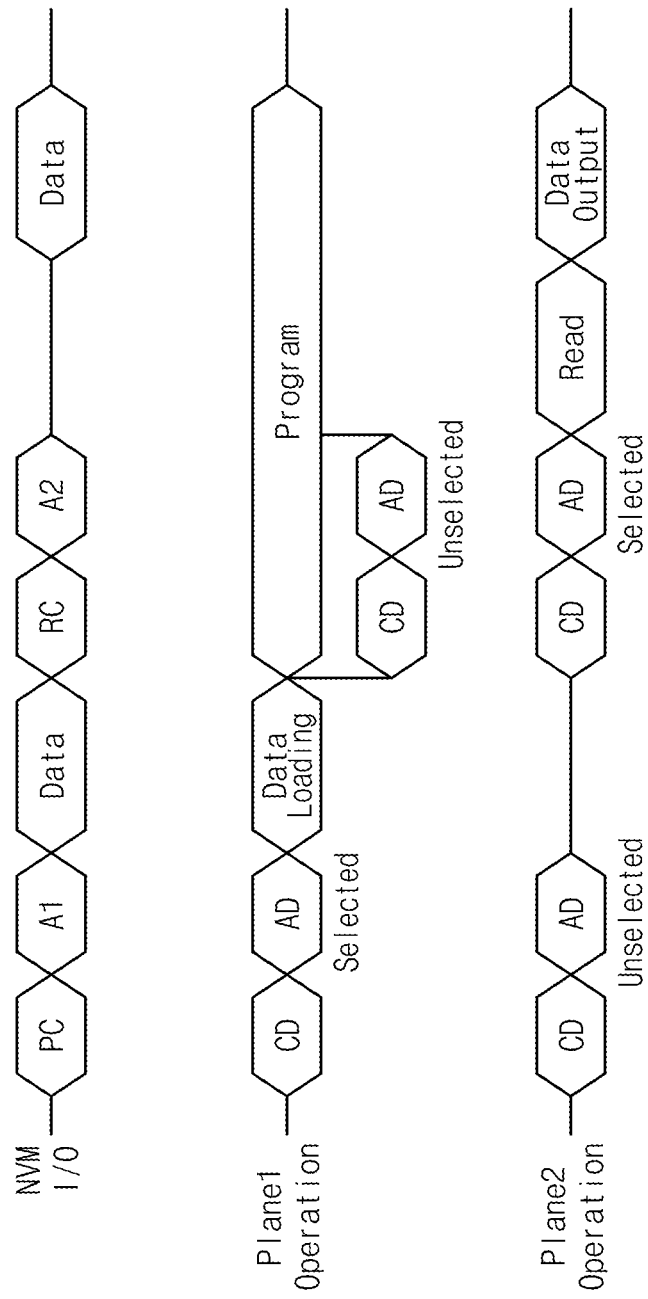
FIG. 3 is a timing diagram describing an operation of a nonvolatile memory device in FIG. 1 according to an embodiment of the inventive concept.

FIG. 3 is a timing diagram describing operation of the nonvolatile memory device 100 of FIG. 1. In FIG. 3, I/O timing for the nonvolatile memory device 100 relative to the first plane P1 and the second plane P2 are illustrated.

Referring to FIGS. 1 and 3, the nonvolatile memory device 100 first receives a program command PC. At this time, each control logic and high voltage generators 140a and 140b of the first and second planes P1 and P2 may decode the program command PC. In FIG. 3, the term "CD" may indicate command decoding that is executed at each of the first and second planes P1 and P2.

A first address A1 is also provided to the nonvolatile memory device 100. Address decoders 120a and 120b of the first and second planes P1 and P2 respectively decode the first address A1. In FIG. 3, the term "AD" may indicate address decoding that is respectively executed by the first and second planes P1 and P2.

The decoded address may indicate (or "point to") the first plane P1. That is, the first plane P1 may be selected according to the decoded address, while the second plane P2 is not selected. Thus, the control logic and high voltage generator 140b of the unselected second plane P2 may ignore the decoded command.

"Program data" externally provided to the nonvolatile memory device 100 is transferred via the data I/O circuit 150. In response, the data I/O circuit 150 will provide "input data" to data lines DL. A read and write circuit 130a of the first plane P1 being selected will "load" the data input from the data lines DL. Afterwards, a program operation associated with the first plane P1 may be performed using data loaded to the read and write circuit 130a.

During programming of the first plane P1, a read command RC may be provided to the nonvolatile memory device 100. Each of the control logic and high voltage generators 140a and 140b of the first and second planes P1 and P2 may decode the read command RC. A second address A2 associated with the read command RC is received and decoded by the address decoders 120a and 120b. Here, it is assumed that the second address A2 points to the second plane P2.

During the ongoing program operation directed to the first plane P1, the second-received read operation directed to the second plane P2 may be carried out. That is, "read data" may be retrieved from the memory cell array 110b and stored in the read and write circuit 130b. Thus, during the program operation directed to the first plane P1, read data stored in the read and write circuit 130b may be output via the data I/O circuit 150 to an external circuit (e.g., a host or controller).

As described above, while the first plane P1 is being programmed, the second plane P2 may be read in parallel and the resulting read data output. In this context, the phrase "in parallel" denotes at least two operations being executed with some temporal overlap, either wholly or in part. Since the first and second planes P1 and P2 may perform a program, read, or erase operation independently, the overall operating speed of the nonvolatile memory device 100 may be increased.

In the foregoing example, read and program operations are executed in parallel between the first and second planes P1 and P2 in respective response to a program command PC and a read command RC. However, embodiments of the inventive concept is not limited thereto.

In the foregoing example, it is understood that but for the ongoing program operation directed to the first plane P1, the address decoder 120a would decode the second address A2 and the control logic and high voltage generator 140a would decode the second-received read command RC. However, due to the "busy state" of the first plane P1 related to the ongoing program operation, the address decoder 120a of the first plane P1 will ignore the second address A2, and the control logic and high voltage generator 140a will ignore the read command RC. That is, the address decoder 120a and the control logic and high voltage generator 140a may be configured to perform respective decoding operations only when in an "idle state" (i.e., when the first plane P1 is not currently executing an operation).

FIGS. 4A, 4B and 4C are tables respectively illustrating examples of a ready/busy signal R/nB generated by the data I/O circuit 150 of FIG. 1.

Referring to FIGS. 1 and 4A, when at least one of first and second planes P1 and P2 is in the idle state, the data I/O circuit 150 output the ready/busy signal R/nB indicating an idle state (e.g., logically "low"). However, when both the first and second planes P1 and P2 are in the busy state, the data I/O circuit 150 outputs the ready/busy signal R/nB indicating a busy state (e.g., logically "high").

Referring to FIGS. 1 and 4B, when at least one of the first and second planes P1 and P2 is in the busy state, the data I/O circuit 150 outputs the ready/busy signal R/nB indicating the busy state, and only when both of the first and second planes P1 and P2 are in the idle state, the data I/O circuit 150 outputs the ready/busy signal R/nB indicating the idle state.

Referring to FIGS. 1 and 4C, when both the first and second planes P1 and P2 are in the idle state, the data I/O circuit 150 outputs the ready/busy signal R/nB indicating an idle state, and when both of the first and second planes P1 and P2 are in the busy state, the data I/O circuit 150 outputs the ready/busy signal R/nB indicating the busy state. However, when the first plane P1 is in the busy state and the second plane P2 is in the idle state, the data I/O circuit 150 outputs the ready/busy signal R/nB having a first waveform, but when the second plane P2 is in the busy state and the first plane P1 is in the idle state, the data I/O circuit 150 outputs the ready/busy signal R/nB having a second waveform, different from the first waveform.

Figure 5:
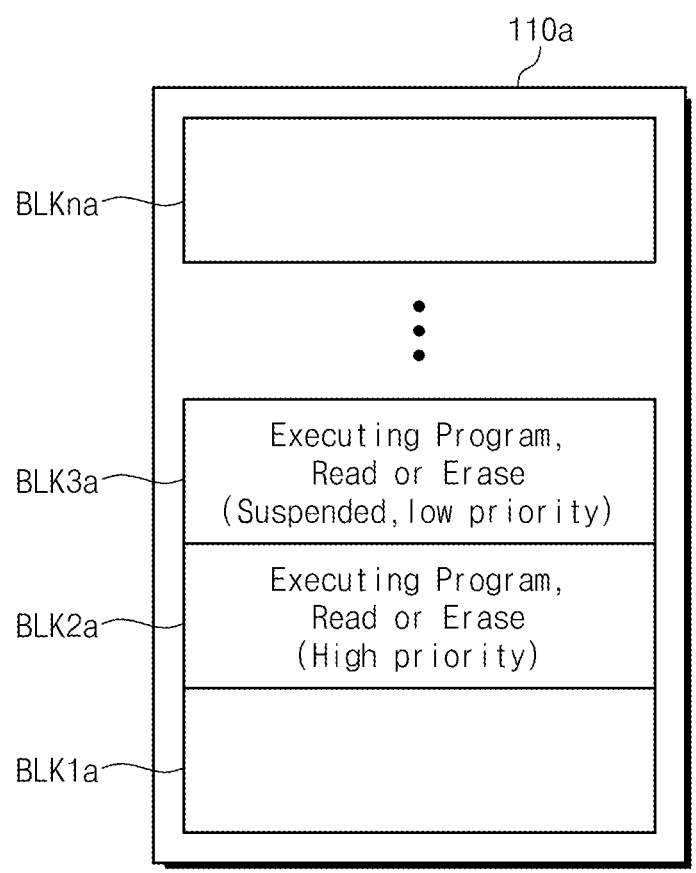
FIG. 5 is a diagram describing a program, read or erase operation executed at a memory cell array of a first plane.

FIG. 5 illustrates memory array 110a of first plane P1 of FIG. 1 and further describes one approach to the execution of program, read and/or erase operations. Referring to FIGS. 1 and 5, it is assumed that a first operation (e.g., a program, read, or erase operation) is directed to the third memory block BLK3a in response to a received firs command. During execution of the first operation, a second command is received for a second operation (e.g., a program, read, or erase operation) directed to the second memory block BLK2a. It is further assumed that the second command has a higher priority than the first command. In such a case, execution of the first operation suspended, and the second operation is executed. Only after the second operation directed to the second memory block BLK2a is completed is the first operation directed to the third memory block BLK3a resumed.

Suspending and resuming a first-received but lower priority operation in favor of a later-received and higher priority operation may also be performed with respect to the second plane P2. As will be appreciated, the use of suspend/resume execution priority effectively allocates memory device resources to higher priority operations, thereby improving the overall operating speed for the nonvolatile memory device 100.

Figure 6:
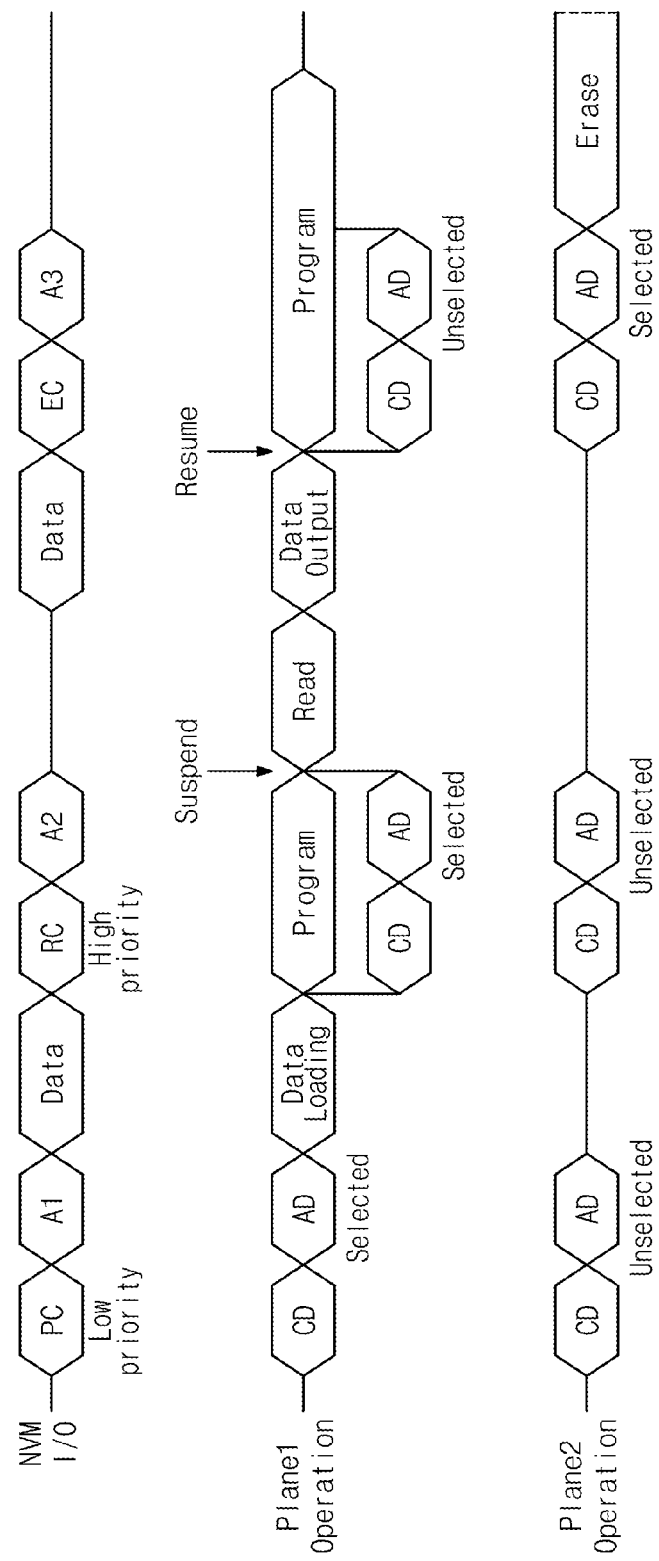
FIG. 6 is a timing diagram describing an operation of a nonvolatile memory device in FIG. 1 according to another embodiment of the inventive concept.

FIG. 6 is a timing diagram further describing operation of nonvolatile memory device 100 of FIG. 1 according to an embodiment of the inventive concept. In FIG. 6, I/O timing for the nonvolatile memory device 100 as relates to the first plane P1 and the second plane P2 is illustrated.

Referring to FIGS. 1 and 6, the nonvolatile memory device 100 receives a first program command PC. The first program command PC indicating a program operation is assumed to have a relatively low execution priority. Each of control logic and high voltage generators 140a and 140b of first and second planes P1 and P2 may respectively decode the program command PC.

A first address A1 associated with the first program command PC is also provided to the nonvolatile memory device 100. Address decoders 120a and 120b of the first and second planes P1 and P2 may respectively decode the first input address. However, it is assumed that the first plane P1 is selected by the decoded address AD (i.e., the first operation indicated by the first command PC is directed to the first plane P1).

Program data provided to the nonvolatile memory device 100 with the first program command and first address is loaded to the read and write circuit 130a of the first plane P1. Then, the (first) program operation directed to the first plane P1 may be executed using the loaded data.

During programming of the first plane P1, a second command RC indicating a read operation is provided to the nonvolatile memory device 100. The read command RC is assumed to have a relatively higher priority than the first command PC. Again, each of the control logic and high voltage generators 140a and 140b of the first and second planes P1 and P2 may decode the read command RC.

A second address A2 associated with the (second) read command RC is also received by the nonvolatile memory device 100. The address decoders 120a and 120b may decode the second address A2.

In one case, the read operation (i.e., the second command and the accompanying second address) might be directed to the second plane P2 resulting in parallel execution of the first and second operations. In another case, however, the red operation might be directed to the first plane P1. Since the priority of the second command RC is higher than that of the first command PC and the first operation is already being executed in the first plane P1, the first operation is suspended and data associated with the ongoing program operation is separately backed up.

After the program operation is suspended, the read operation directed to the first plane P1 is executed. As before, the read data is stored in a read and write circuit 130a, and subsequently provided to an external circuit via data lines DL and a data I/O circuit 150.

After the read data is output, the "backed-up data" associated with the first-received program operation is recovered, and the first operation is resumed for the first plane P1 using the recovered data.

During the resumed programming of the first plane P1, a third command (an erase command EC) is received by the nonvolatile memory device 100. Again, each of the control logic and high voltage generators 140a and 140b of the first and second planes P1 and P2 may decode the erase command EC.

A third address A3 associated with the erase command EC is also received by the nonvolatile memory device 100. The address decoders 120a and 120b decode the third address A3 that indicates the second plane P2. During the (first operation) programming of the first plane P1, the (third operation) erase operation is executed in parallel on the second plane P2.

Thus, in the foregoing illustrated embodiments, the nonvolatile memory device 100 may identify priority information associated with a received command. This priority information may then be used to control suspend/resume functionality for the various operations.

In other embodiments, a "priority determination" made in relation to priority information may be made by an external device (e.g., a controller) operating with the nonvolatile memory device 100. Then, using the priority determination, the external device may communicate certain control signals (e.g., specific suspend and resume commands and/or control signals) to the nonvolatile memory device 100.

Figure 7:
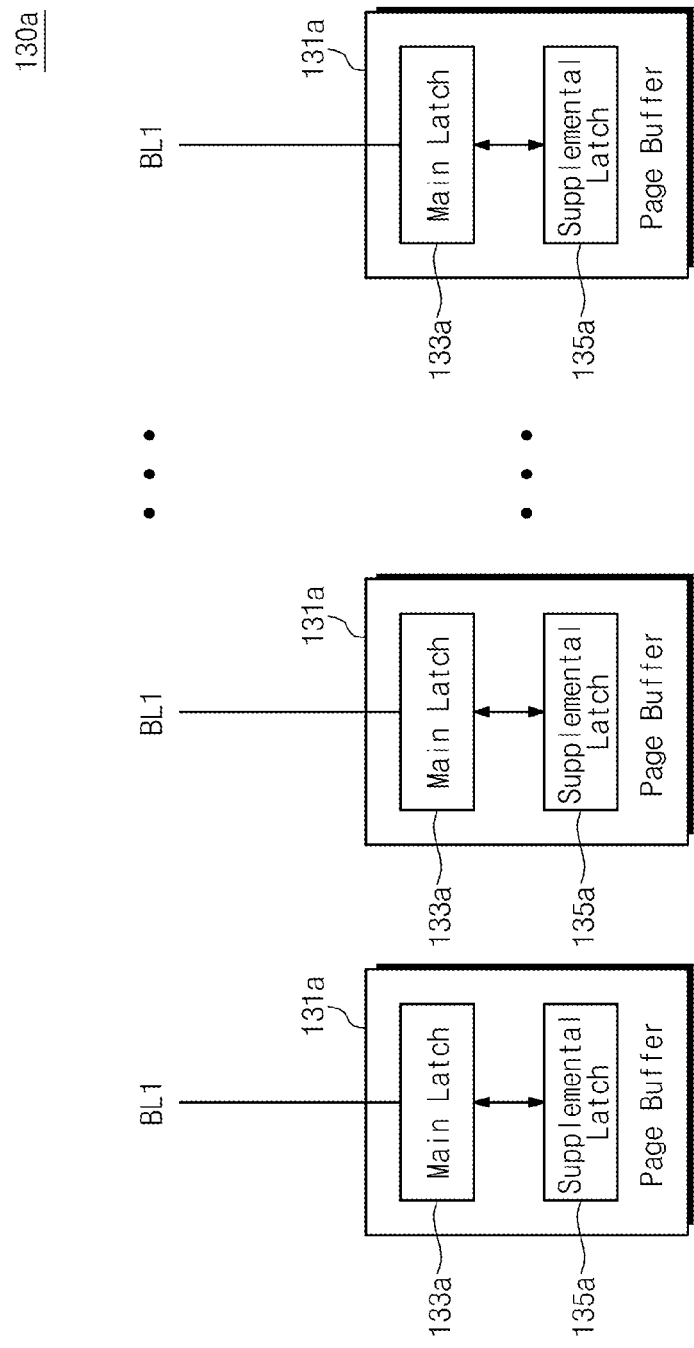
FIG. 7 is a block diagram schematically illustrating a read and write circuit of a first plane in FIG. 1 according to an embodiment of the inventive concept.

FIG. 7 is a block diagram further illustrating the read and write circuit of a first plane of FIG. 1 according to an embodiment of the inventive concept. Referring to FIGS. 1 and 7, the read and write circuit 130a includes a plurality of page buffers 131a respectively connected to one of a plurality of bit lines BL1. Each of the plurality of page buffers 131a includes a main latch 133a and a supplemental latch 135a.

The main latches 133a may be used to store data associated with an operation being executed (i.e., "a current operation"). For example, the main latches 133a may be used to store program data, data associated with a program verification result, read data, data associated with an erase verification result, and the like.

In contrast, the supplemental latches 135a may be used to store backup data associated with "a suspended operation". For example, the supplemental latches 135a may be used to store program data associated with a suspended program operation, data associated with a program verification result, read data, data associated with an erase verification result, and the like.

During an operation, program data, data associated with a program verification result, read data, data associated with an erase verification result, and the like may be stored in the main latches 133a. When an operation is suspended, data stored in the main latches 133a may be backed up by the supplemental latches 135a. When the suspended operation is resumed, the data stored in the supplemental latches 135a may be transferred to the main latches 133a. For example, program data associated with a suspended program operation may be recovered.

Figure 8:
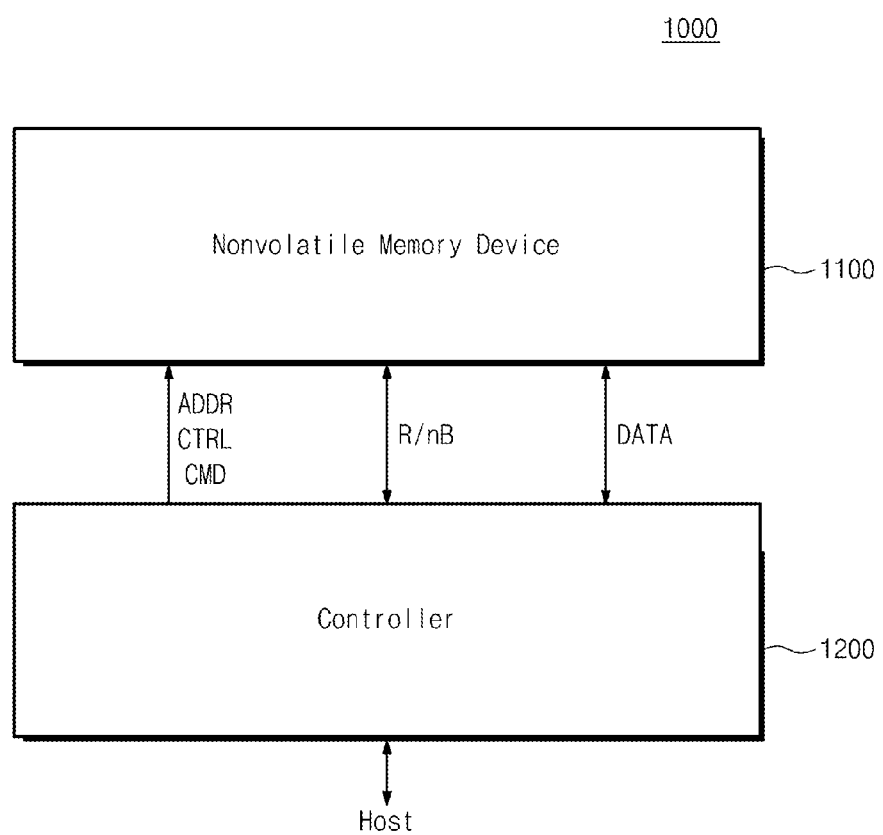
FIG. 8 is a block diagram schematically illustrating a memory system according to an embodiment of the inventive concept.

FIG. 8 is a block diagram illustrating a memory system according to an embodiment of the inventive concept. Referring to FIG. 8, a memory system 1000 generally comprises a nonvolatile memory device 1100 and a controller 1200.

The nonvolatile memory device 1100 may be substantially identical to nonvolatile memory device 100 described in relation to FIGS. 1 through 7, and may be operated in similar manner.

The controller 1200 between a host and the nonvolatile memory device 1100. In response to a request from the host, the controller 1200 controls operation of the nonvolatile memory device 1100. For example, the controller 1200 may be configured to control a read operation, a write operation, an erase operation, and a background operation of the nonvolatile memory device 1100. The controller 1200 may be configured to provide an interface between the nonvolatile memory device 1100 and the host. The controller 1200 may be configured to drive firmware for controlling the nonvolatile memory device 1100.

In the illustrated embodiments, the controller 1200 may be configured to provide the nonvolatile memory device 1100 with a control signal CTRL, a command CMD, and an address ADDR. The controller 1200 may be configured to exchange data with the nonvolatile memory device 1100. The controller 1200 may be configured to receive a ready/busy signal R/nB from the nonvolatile memory device.

In the illustrated embodiments, the controller 1200 may include constituent elements such as a RAM, a processing unit, a host interface, and a memory interface. The RAM may be used as at least one of a work memory of the processing unit, a cache memory between the nonvolatile memory device 1100 and the host, or a buffer memory between the nonvolatile memory device 1100 and the host. The processing unit may control an overall operation of the controller 1200.

The host interface may communicate with the nonvolatile memory device 1100 according to a specific communication protocol. Exemplarily, the controller 1200 may be configured to communicate with an external device (e.g., the host) via at least one of various protocols such as an USB (Universal Serial Bus) protocol, an MMC (multimedia card) protocol, a PCI (peripheral component interconnection) protocol, a PCI-E (PCI-express) protocol, an ATA (Advanced Technology Attachment) protocol, a Serial-ATA protocol, a Parallel-ATA protocol, a SCSI (small computer small interface) protocol, an ESDI (enhanced small disk interface) protocol, or an IDE (Integrated Drive Electronics) protocol. The memory interface may interface with the nonvolatile memory device 1100. The memory interface may include a NAND interface or a NOR interface.

The memory system 1000 may be configured to further include an error detection and correction (ECC) block. The ECC block may be configured to detect and/or correct error(s)

in read data obtained from the nonvolatile memory device 100 using derived ECC data, such as (e.g.,) parity data. In certain embodiments, the ECC block may be provided as a constituent element of the controller 1200, and/or a constituent element of the nonvolatile memory device 1100.

The controller 1200 and the nonvolatile memory device 1100 may be integrated to one semiconductor device. The controller 1200 and the nonvolatile memory device 1100 may be integrated to form a memory card. For example, the controller 1200 and the nonvolatile memory device 1100 may be integrated to form a memory card such as a PC (or, PCMCIA) card, a Compact Flash (CF) card, a SmartMedia (SM) card, a memory stick, a multimedia card (MMC, RS-MMC, MMC-micro), an SD card (SD, miniSD, SDHC), a Universal Flash Storage (UFS) device, or the like.

In the illustrated embodiments, the controller 1200 and the nonvolatile memory device 1100 may be integrated to form a Solid State Drive (SSD). The SSD may include a storage device which is configured to store data using semiconductor memories. In case that the memory system 1000 is used as the SSD, an operating speed of a host connected with the memory system 1000 may be remarkably improved.

The memory system 1000 may be used as computer, portable computer, Ultra Mobile PC (UMPC), workstation, netbook, PDA, web tablet, a tablet computer, wireless phone, mobile phone, smart phone, e-book, PMP (portable multimedia player), DMB (Digital Multimedia Broadcasting) player, digital camera, digital audio recorder/player, digital picture/video recorder/player, smart television, portable game machine, navigation system, black box, 3-dimensional television, storage forming a data center, a device capable of transmitting and receiving information at a wireless circumstance, one of various electronic devices constituting home network, one of various electronic devices constituting computer network, one of various electronic devices constituting telematics network, RFID, or one of various electronic devices constituting a computing system.

In the illustrated embodiments, a nonvolatile memory device 1100 or a memory system 1000 may be packed by various types of packages such as PoP (Package on Package), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

Figure 9:
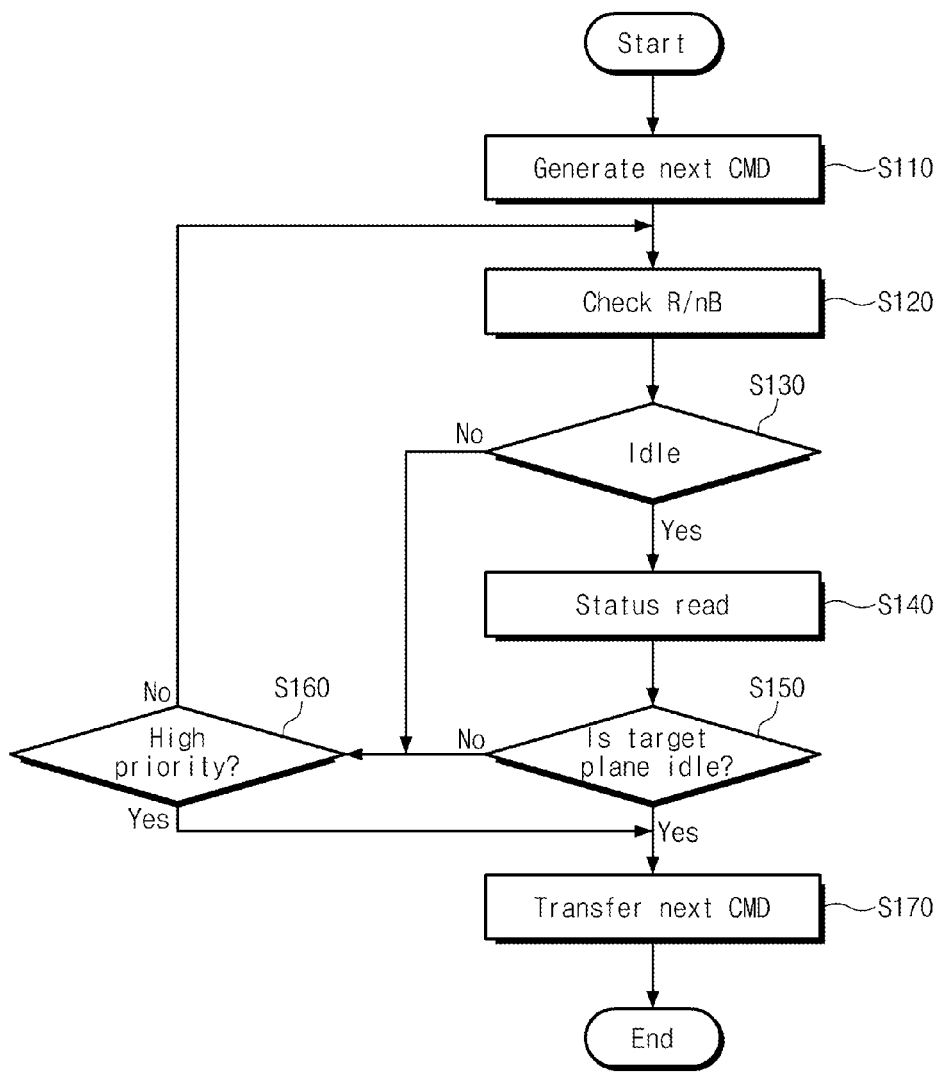
FIG. 9 is a flowchart summarizing an operating method of a controller in FIG. 8 according to an embodiment of the inventive concept.

FIG. 9 is a flowchart summarizing an operating method for the controller 1200 of FIG. 8 according to an embodiment of the inventive concept. In the illustrated embodiments, the operating method of FIG. 9 may be used when the nonvolatile memory device 1100 provides a ready/busy signal R/nB like the ones described by the table of FIG. 4A.

Referring to FIGS. 1, 8, and 9, in operation S110, the controller 1200 may be used to generate a "next" command. The controller 1200 may generate the next command under the control of an external host or according to a predetermined schedule.

In operation S120, the controller 1200 checks the ready/busy signal R/nB provided by the nonvolatile memory device 1100.

In operation S130, a determination is made as to whether the ready/busy signal R/nB indicates the idle state. An idle state indication by the ready/busy signal R/nB may be made for at least one of the first and second planes P1 and P2. If the ready/busy signal R/nB indicates an idle state (S130=YES), a status read operation is executed in operation S140. The status read operation may be an operation that is executed by the controller 1200 to check a status of the nonvolatile memory device 1200. Using the status read operation, the idle state or the busy state may be determined for each of the first and second planes P1 and P2.

In operation S150, a determination is made as to whether a target plane is in the idle state. If the target plane is in the idle state (S150=YES), the next command is transferred to the nonvolatile memory device 1100 for execution in operation S170.

However, if the ready/busy signal R/nB does not indicate the idle state (S130=NO) or if the target plane is in the busy state (S150=NO), the method proceeds to operation S160, in which priority is determined. If the priority of the next command is higher than a current command being executed for the target plane, the method proceeds to operation S170 and the next command is transferred to the nonvolatile memory device 1100. Of note, a separate suspend command may be transferred to the nonvolatile memory device 110 together with the next command. However, if the priority of the next command is lower than that of the current command being executed with respect to the target plane (S160=NO), the method returns to operation S120.

Figure 10:
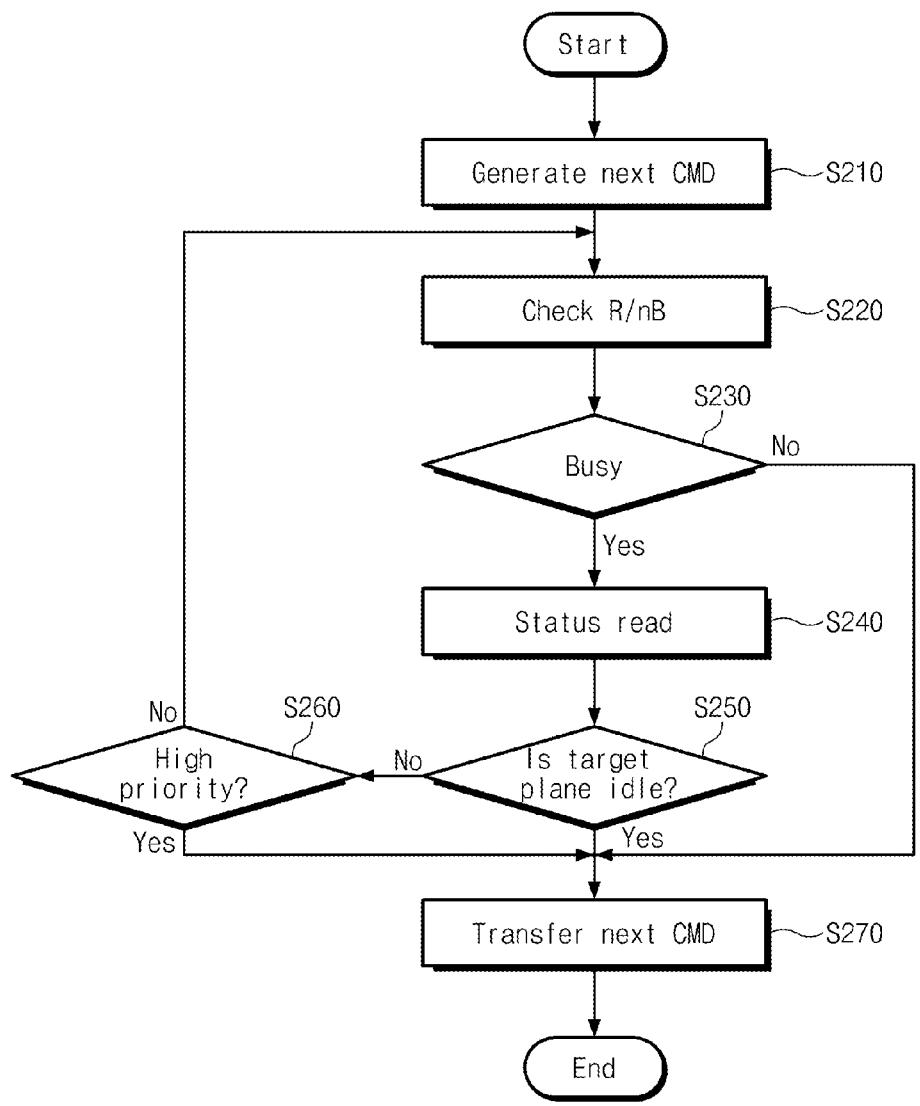
FIG. 10 is a flowchart summarizing an operating method of a controller in FIG. 8 according to another embodiment of the inventive concept.

FIG. 10 is a flowchart summarizing an operating method for the controller 1200 of FIG. 8 according to another embodiment of the inventive concept. In the illustrated embodiment, the operating method of FIG. 10 may be controlled by the controller 1200 when the nonvolatile memory device 1100 provides a ready/busy signal R/nB according to the table of FIG. 4B.

Referring to FIGS. 1, 8, and 10, in operation S210, the controller 1200 generates a next command.

In operation S220, the controller 1200 checks the state of the ready/busy signal R/nB relative to the first and second planes P1 and P2. When the ready/busy signal R/nB indicates the idle state (S230=NO), the method proceeds to operation S270, in which the next command is transferred to the nonvolatile memory device 1100.

However, if the ready/busy signal R/nB indicates the busy state (S230=YES), the status read operation is executed in operation S240. In operation S250, the controller 1200 determines if a target plane is idle according to the state read result. If the target plane is in the idle state (S250=YES), the controller 1200 transfers the next command to the nonvolatile memory device 1100 in operation S270. However, if the target plane is in the idle state (S250=NO), the priority of the next command is determined in operation S260.

If the priority of the next command is higher than that of a current command being executed, the method proceeds to operation S270, in which the next command is transferred to the nonvolatile memory device 1100. Here again, the controller 1200 may send a separate suspend command with the current command. However, if the priority of the next command is lower than that of the current command, the method returns to operation S220.

In the illustrated embodiments, when the nonvolatile memory device 1100 provides the ready/busy signal R/nB as illustrated in FIG. 4C, the controller 1200 may determine an idle state for a target plane by checking the level and waveform of the ready/busy signal R/nB. That is, a separate status read operation may not be required.

Figure 11:
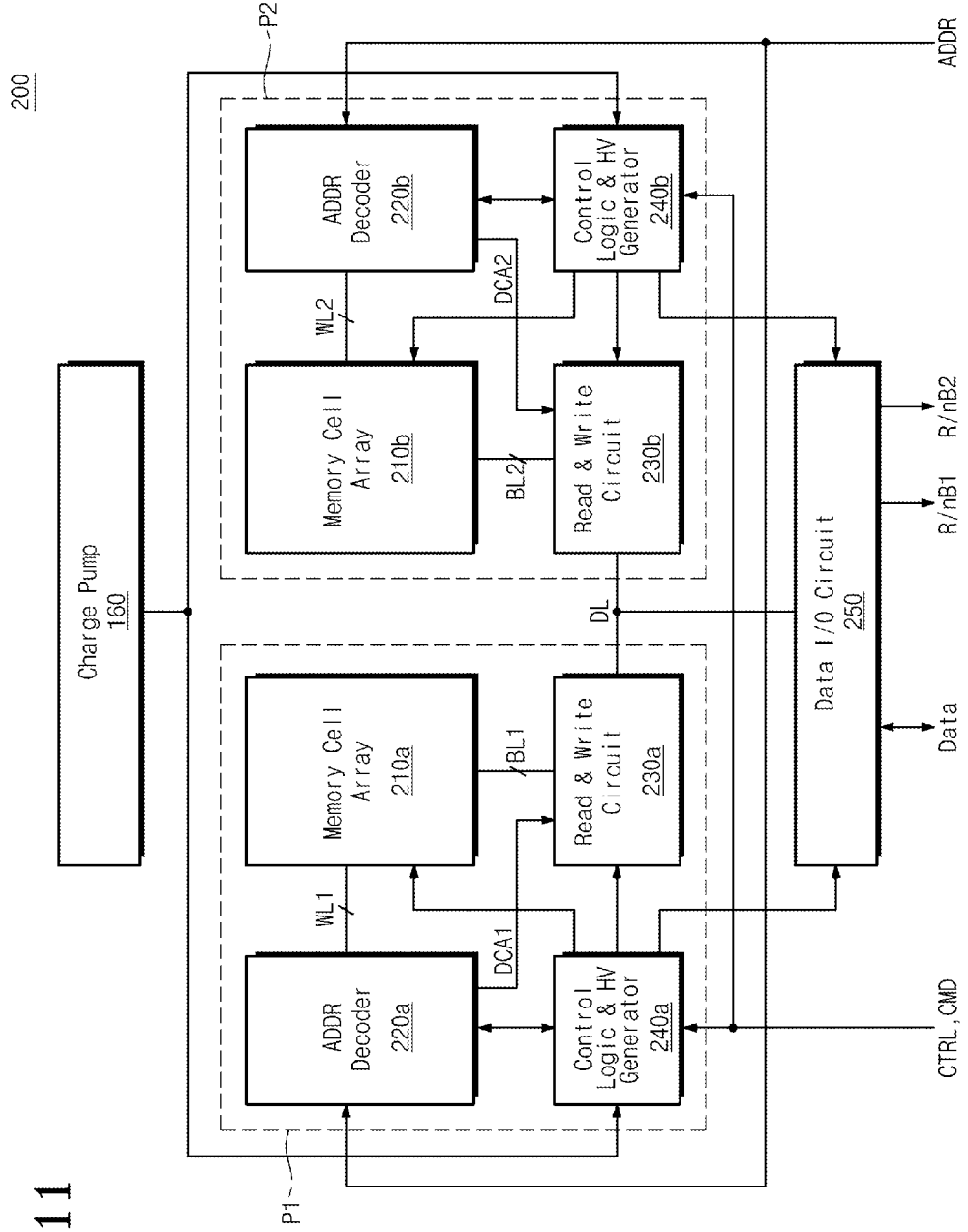
FIG. 11 is a block diagram schematically illustrating a nonvolatile memory device according to another embodiment of the inventive concept.

FIG. 11 is a block diagram illustrating a nonvolatile memory device according to another embodiment of the inventive concept. Referring to FIG. 11, the first plane P1 may include a memory cell array 210a, an address decoder 220a, a read/write circuit 230a, and control logic and high voltage generator 240a. The second plane P2 may include a memory cell array 210b, an address decoder 220b, a read/write circuit 230b, and control logic and high voltage generator 240b. The first and second planes P1 and P2 may have the same structure. Compared with a nonvolatile memory device 100 in FIG. 1, a data I/O circuit 250 may output two (2) separate ready/busy signals R/nB1 and R/nB2.

FIG. 12 is a table illustrating ready/busy signals according to states of the first and second planes. Referring to FIGS. 11 and 12, a first ready/busy signal R/nB1 may indicate an idle state or a busy state of a first plane P1. A second ready/busy signal R/nB2 may indicate an idle state or a busy state of a second plane P2.

It is possible to readily determine idle and busy states of the first and second planes P1 and P2 by assigning the ready/busy signals R/nB1 and R/nB2 to the first and second planes P1 and P2.

The controller 1200 of the memory system 1000 described with reference to FIG. 8 may be modified or applied so as to receive the ready/busy signals R/nB1 and R/nB2 and to determine idle and busy states of the first and second planes P1 and P2 according to the input ready/busy signals R/nB1 and R/nB2.

Figure 13:
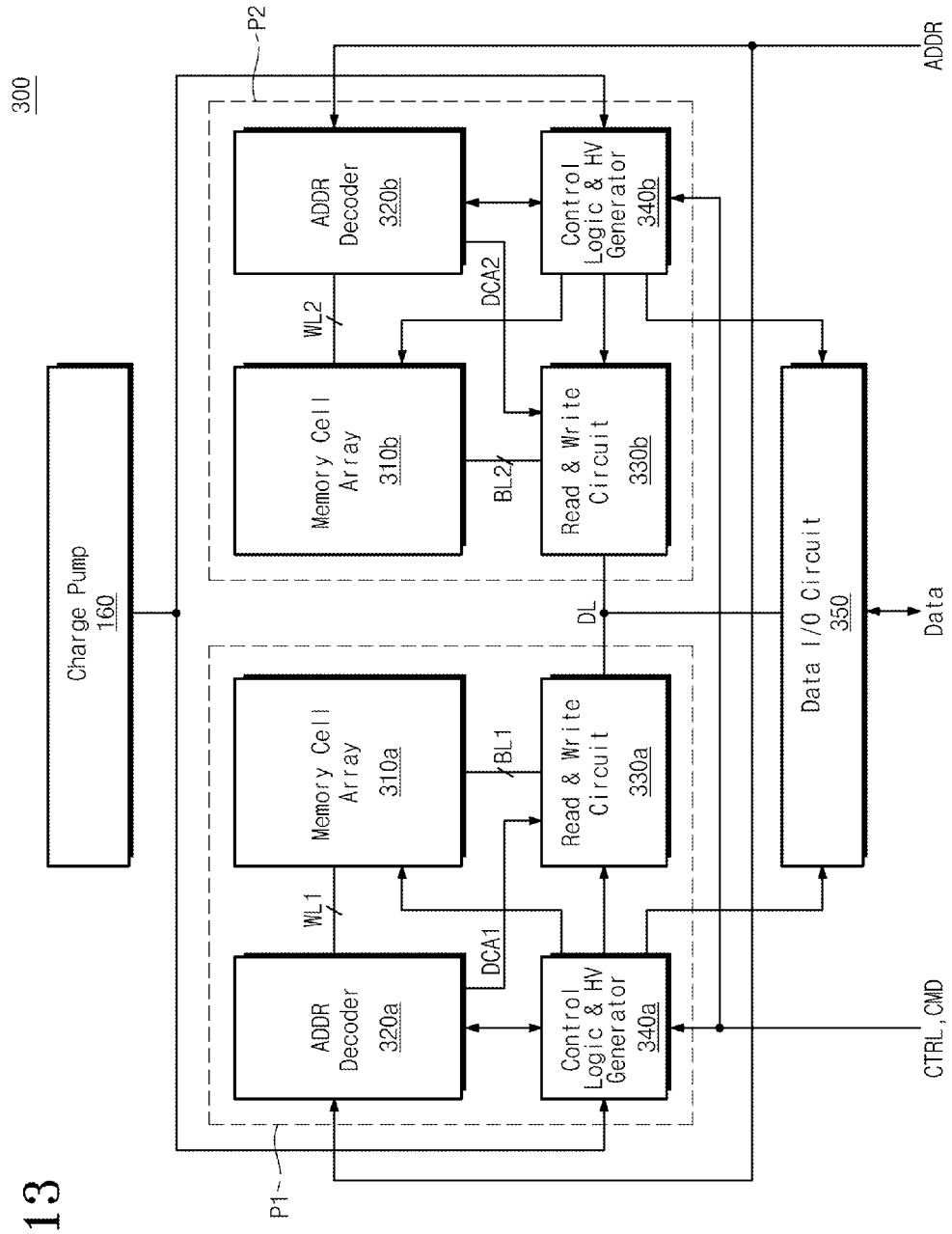
FIG. 13 is a block diagram schematically illustrating a nonvolatile memory device according to still another embodiment of the inventive concept.

FIG. 13 is a block diagram schematically illustrating a nonvolatile memory device according to still another embodiment of the inventive concept. Referring to FIG. 13, the first plane P1 may include a memory cell array 310a, an address decoder 320a, a read/write circuit 330a, and control logic and high voltage generator 340a. The second plane P2 may include a memory cell array 310b, an address decoder 320b, a read/write circuit 330b, and control logic and high voltage generator 340b. The first and second planes P1 and P2 may have the same structure. Compared with a nonvolatile memory device 100 in FIG. 1, a data I/O circuit 350 does not output a ready/busy signal R/nB.

A controller 1200 of a memory system 1000 described with reference to FIG. 8 may be modified or applied so as to determine idle and busy states of first and second planes P1 and P2 without receiving a ready/busy signal R/nB.

Figure 14:
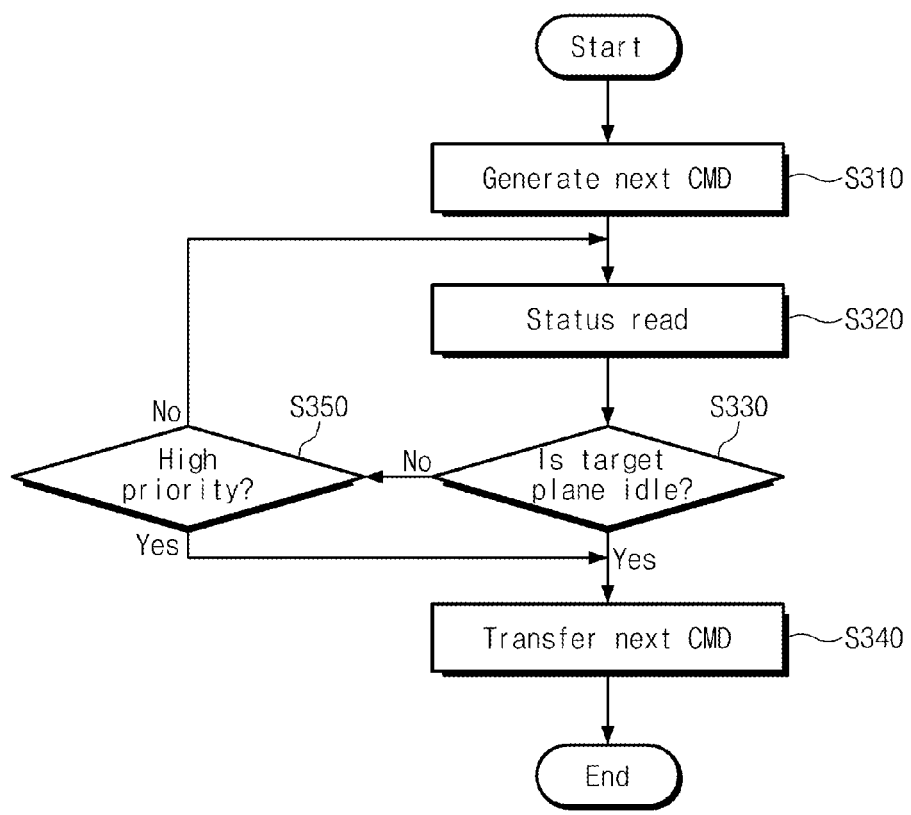
FIG. 14 is a flowchart summarizing an operating method of a controller communicating with a nonvolatile memory device in FIG. 13 according to still another embodiment of the inventive concept.

FIG. 14 is a flowchart summarizing an operating method for a controller operating in conjunction with a nonvolatile memory device in FIG. 13 according to still another embodiment of the inventive concept. Referring to FIGS. 8, 13, and 14, in operation S310, a controller 1200 generates a next command.

In operation S320, the controller 1200 performs a status read operation. In operation S330, the controller 1200 may determine whether a target plane is at an idle state based on a status of the read operation result. If the target plane is in the idle state, in operation S340, the controller 1200 transfers the next command to the nonvolatile memory device 1100. If the target plane is determined not to be in the idle state, the method proceeds to operation S350, in which the command priority is determined. If the priority of the next command is higher than that of a current command being executed in the target plane, the method proceeds to operation S340, in which the next command is transferred to the nonvolatile memory device 1100. Again, a separate suspend command can be sent with the next command. If the priority of the next command is lower than that of the current command, the method proceeds to operation S320.

Figure 15:
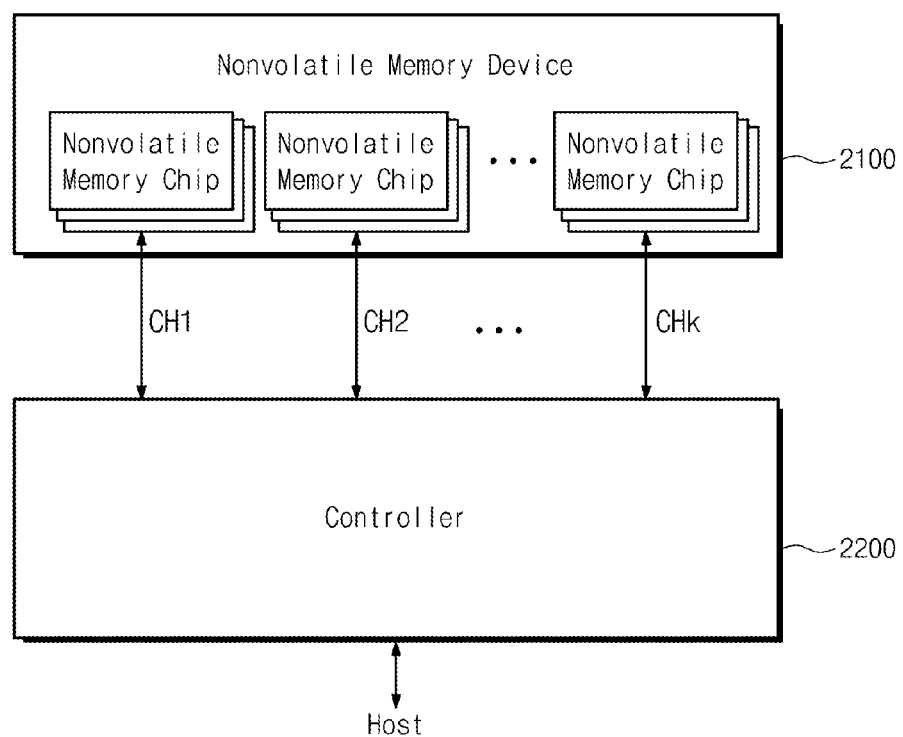
FIG. 15 is a block diagram illustrating an application of a memory system in FIG. 8.

FIG. 15 is a block diagram illustrating one possible application for the memory system of FIG. 8. Referring to FIG. 15, a memory system 2000 may include a nonvolatile memory device 2100 and a controller 2200. The nonvolatile memory device 2100 may include a plurality of nonvolatile memory chips, which form a plurality of groups. Nonvolatile memory chips in each group may be configured to communicate with the controller 2200 via one common channel. In the illustrated embodiments, the plurality of nonvolatile memory chips may communicate with the controller 2200 via a plurality of channels CH1 to CHk.

Each nonvolatile memory chip may be a nonvolatile memory device 100 described in relation to FIGS. 1 through 7, a nonvolatile memory device 200 described in relation to FIGS. 11 and 12, or a nonvolatile memory device 300 described in relation to FIGS. 13 and 14, and may operate in the same manner. The controller 2200 may operate in a manner described in relation to FIG. 9, 10, or 14.

In FIG. 15, there is described the case that one channel is connected with a plurality of nonvolatile memory chips. However, the memory system 2000 can be modified such that one channel is connected with one nonvolatile memory chip.

Figure 16:
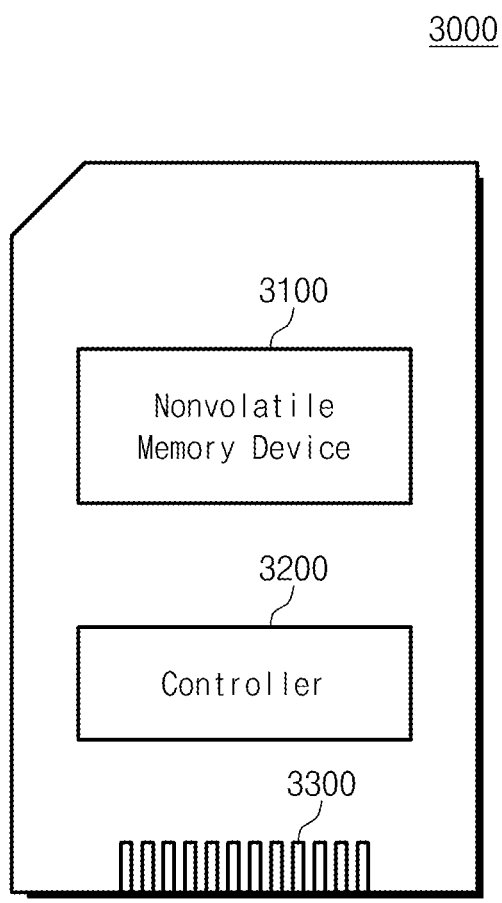
FIG. 16 is a diagram illustrating a memory card according to an embodiment of the inventive concept.

FIG. 16 is a diagram illustrating a memory card according to an embodiment of the inventive concept. Referring to FIG. 16, a memory card 3000 may include a nonvolatile memory device 3100, a controller 3200, and a connector 3300.

The nonvolatile memory device 3100 may be a nonvolatile memory device 100 described in relation to FIGS. 1 through 7, a nonvolatile memory device 200 described in relation to FIGS. 11 and 12, or a nonvolatile memory device 300 described in relation to FIGS. 13 and 14, and may operate in the same manner. The controller 3200 may operate in a manner described in relation to FIG. 9, 10, or 14.

The connector 3300 may connect the memory card 3000 with a host electrically.

The memory card 3000 may be formed of memory cards such as a PC (PCMCIA) card, a CF card, an SM (or, SMC) card, a memory stick, a multimedia card (MMC, RS-MMC, MMCmicro), a security card (SD, miniSD, microSD, SDHC), a universal flash storage (UFS) device, and the like.

Figure 17:
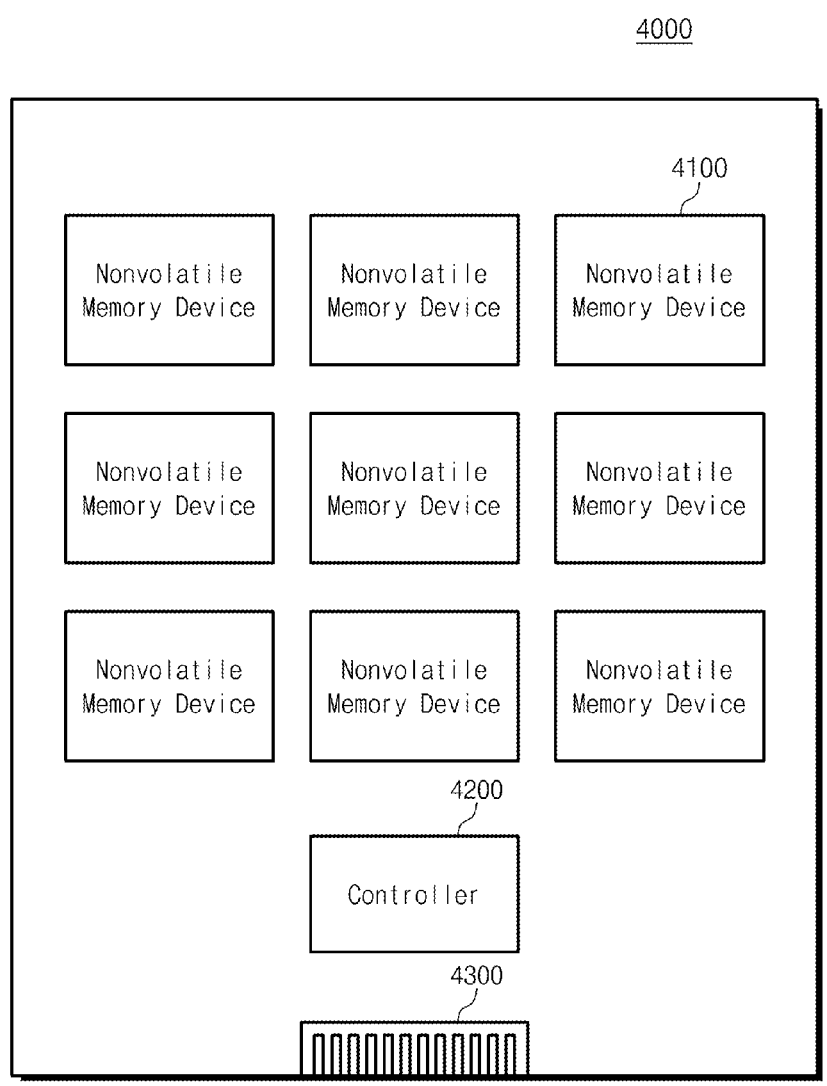
FIG. 17 is a diagram illustrating a solid state drive according to an embodiment of the inventive concept.

FIG. 17 is a diagram illustrating a solid state drive (SSD) according to an embodiment of the inventive concept. Referring to FIG. 17, a SSD 4000 may include a plurality of nonvolatile memory devices 4100, a controller 4200, and a connector 4300.

Each of the nonvolatile memory devices 4100 may be a nonvolatile memory device 100 described in relation to FIGS. 1 through 7, a nonvolatile memory device 200 described in relation to FIGS. 11 and 12, or a nonvolatile memory device 300 described in relation to FIGS. 13 and 14, and may operate in the same manner. The controller 4200 may operate in a manner described in relation to FIG. 9, 10, or 14.

The connector 4300 may connect the solid state drive 4000 with a host electrically.

Figure 18:
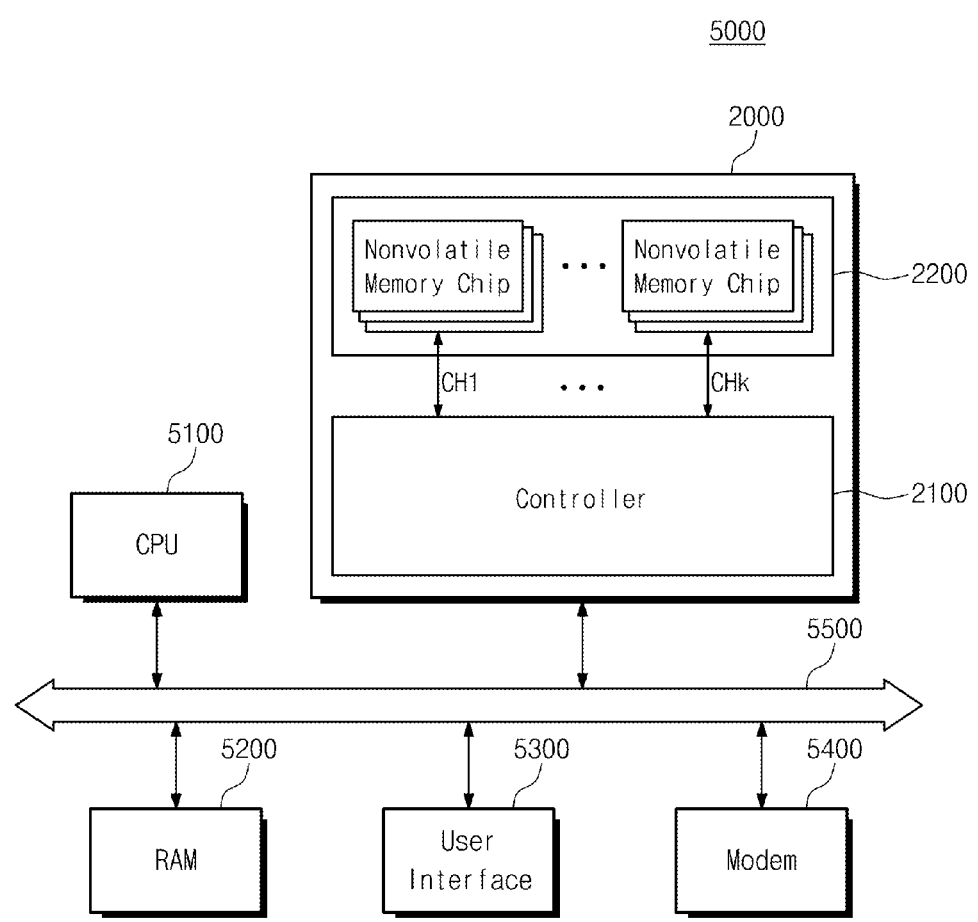
FIG. 18 is a block diagram illustrating a computing system according to an embodiment of the inventive concept.

FIG. 18 is a block diagram illustrating a computational system according to an embodiment of the inventive concept. Referring to FIG. 18, a computational system 5000 may include a central processing unit 5100, a RAM 5200, a user interface 5300, a modem 5400, and a memory system 2000.

The memory system 2000 may be connected electrically with the elements 5100 to 5400 via a system bus 5500. Data provided via the user interface 5300 or processed by the central processing unit 5100 may be stored in the memory system 2000.

In FIG. 18, there is illustrated the case that a nonvolatile memory device 2200 is connected to the system bus 500 via a controller 2100. However, the nonvolatile memory device 2200 can be electrically connected directly to the system bus 5500.

The memory system 2000 in FIG. 18 may be a memory system described in relation to FIG. 18. However, the memory system 2000 can be replaced with a memory system 1000 described with reference to FIG. 8.

In the illustrated embodiments, the computing system can be configured to include all memory systems 1000 and 2000 described with reference to FIGS. 8 through 15.

Within the context of the certain embodiments of the inventive concept, different planes of a nonvolatile memory device may be programmed, read, or erased independently, and may make suspending or resuming of an operation according to the priority. Thus, it is possible to provide a nonvolatile memory device with an improved operating speed and an operating method of a controller controlling the nonvolatile memory device.

The above-disclosed subject matter is to be considered illustrative, and not restrictive, and the appended claims are intended to cover all such modifications, enhancements, and other embodiments. Thus, to the maximum extent allowed by law, the scope is to be determined by the broadest permissible interpretation of the following claims and their equivalents, and shall not be restricted or limited by the foregoing detailed description.

What is claimed is:

1. A nonvolatile memory device, comprising:
   a first plane configured to perform a first operation directed to a first memory cell array in response to a first command received from a controller,
   wherein the first plane comprises:
      the first memory cell array including first nonvolatile memory cells;
      a first address decoder that decodes a first address received from the controller with the first command to generate first word lines signals applied to the first nonvolatile memory cells via first word lines;
      a first read and write circuit connected with the data I/O circuit via the common data bus and connected with the first nonvolatile memory cells via first bit lines; and
      first control logic that decodes the first command and controls the operation of the first address decoder and first read and write circuit in response to the decoded first command;
   a second plane configured to perform a second operation directed to a second memory cell array physically separate from the first memory cell array in response to a second command received from the controller,
   wherein the second plane comprises:
      the second memory cell array including second nonvolatile memory cells;
      a second address decoder that decodes a second address received from the controller with the second command to generate second word lines signals applied to the second memory cells via second word lines;
      a second read and write circuit connected with the data I/O circuit via the common data bus and connected with the second memory cells via second bit lines; and
      second control logic that controls the operation of the second address decoder and second read and write circuit in response to the decoded second command; and
   a data input/output (I/O) circuit that transfers read data to the controller via a common data bus obtained from at least one of the first memory cell array and the second memory cell array in response to a read command, that transfers program data received from the controller via the common data bus to at least one of the first memory cell array and the second memory cell array in response to a program command, and that provides a ready/busy signal indicating one of an idle state and a busy state,
   wherein the first command and second command are coincidently applied to the first control logic and second control logic by the data I/O circuit,
   the first address and second address are coincidently applied to the first address decoder and second address decoder by the data I/O circuit, and
   the state of the ready/busy signal determines whether the first command and the second command are executed.

2. The nonvolatile memory device of claim 1, wherein the ready/busy signal indicates the idle state except when both of the first command and the second command are being executed in parallel.

3. The nonvolatile memory device of claim 1, wherein the ready/busy signal indicates the idle state only when neither the first command nor the second command is being executed, and indicates the busy state only when both of the first command and the second command are being executed in parallel.

4. The nonvolatile memory device of claim 3, wherein the ready/busy signal further indicates a first waveform when only the first command is being executed, and further indicates a second waveform when only the second command is being executed.

5. The nonvolatile memory device of claim 1, wherein the first plane and the second plane have the same structure and configuration.

6. The nonvolatile memory device of claim 1, wherein the first control logic and the second control logic both receive the first command and the second command via a common control bus, separate from the common data bus.

7. The nonvolatile memory device of claim 1, wherein the first address decoder and the second address decoder both receive the first address and the second address command via a common address bus separate from the common data bus.

8. The nonvolatile memory device of claim 5, wherein the first read and write circuit comprises:
   a plurality of main latches configured to store data associated with a current operation being executed in the first plane; and
   a plurality of supplemental latches configured to store data associated with a suspended operation formerly being executed in the first plane before the current operation.

9. An operating method for a controller that controls a nonvolatile memory device including a plurality of planes, each plane being respectively and independently configured to perform an operation relative to other planes in the plurality of planes, the operating method comprising:
   generating at the controller a next command directed to a target plane among the plurality of planes;
   performing a status read operation to determine whether the target plane is in an idle state or a busy state; and
   if the target plane is in the idle state, transferring the next command to the nonvolatile memory device for execution, and if the target plane is in the busy state determining a priority for the next command.

10. The operating method of claim 9, wherein the target plane is executing a current operation when the next command is generated, and the operating method further comprises:
   determining whether the priority of the next command is higher than a priority of the current command.

11. The operating method of claim 10, further comprising:
   if the priority of the next command is higher than the priority of the current command, immediately transferrin the next command to the nonvolatile memory device, and if the priority of the next command is not higher than the priority of the current command waiting to transfer the next command until after the current command is executed.

12. An operating method for a memory system including a controller and a nonvolatile memory device including a data input/output (I/O) circuit and first and second planes being respectively and independently configured to perform an operation relative, the operating method comprising:
providing a ready/busy signal from the nonvolatile memory device indicating one of an idle state and a busy state for the nonvolatile memory device;
in the controller, generating a next command indicating a first operation directed to the first plane and generating a next address related to the next command; and then,
if the ready/busy indicates the idle state, performing a status read operation to determine whether the first plane is in the idle state, and if the first plane is in the idle state immediately transferring the next command to first control logic of the first plane and second control logic of the second plane, the next address to a first address decoder of the first plane and second address decoder of the second plane and data associated with the next command to a first read and write circuit of the first plane, otherwise waiting to transfer data associated with the next command to the first read and write circuit.

13. The operating method of claim 12, wherein the ready/busy signal indicates the idle state except when both of the first plane and second plane are executing respective commands.

14. The operating method of claim 13, further comprising:
if the ready/busy indicates the busy state, determining a priority for the next command and waiting to transfer the data associated with the next command; and
if the ready/busy indicates the idle state and the status read operation determines that first plane is not in the idle state, waiting to transfer the data associated with the next command.

15. The operating method of claim 12, wherein the ready/busy signal indicates the busy state except when neither of the first plane nor the second plane is executing a command.

16. A memory system comprising:
a controller and a nonvolatile memory device controlled in its operation by the controller, wherein the nonvolatile memory comprises;
a first plane configured to perform a first operation directed to a first memory cell array in response to a first command received from a controller,
wherein the first plane comprises:
the first memory cell array including first nonvolatile memory cells;
a first address decoder that decodes a first address received from the controller with the first command to generate first word lines signals applied to the first nonvolatile memory cells via first word lines:
a first read and write circuit connected with the data I/O circuit via the common data bus and connected with the first nonvolatile memory cells via first bit lines; and
first control logic that decodes the first command and controls the operation of the first address decoder and first read and write circuit in response to the decoded first command;
a second plane configured to perform a second operation directed to a second memory cell array physically separate from the first memory cell array in response to a second command received from the controller,
wherein the second plane comprises:
the second memory cell array including second nonvolatile memory cells:
a second address decoder that decodes a second address received from the controller with the second command to generate second word lines signals applied to the second memory cells via second word lines;
a second read and write circuit connected with the data I/O circuit via the common data bus and connected with the second memory cells via second bit lines; and
second control logic that controls the operation of the second address decoder and second read and write circuit in response to the decoded second command; and
a data input/output (I/O) circuit that transfers read data to the controller via a common data bus obtained from at least one of the first memory cell array and the second memory cell array in response to a read command, that transfers program data received from the controller via the common data bus to at least one of the first memory cell array and the second memory cell array in response to a program command, and that provides a ready/busy signal indicating one of an idle state and a busy state,
wherein the first command and second command are coincidently applied to the first control logic and second control logic by the data I/O circuit,
the first address and second address are coincidently applied to the first address decoder and second address decoder by the data I/O circuit, and
the state of the ready/busy signal determines whether the first command and the second command are executed.

17. The memory system of claim 16, wherein the ready/busy signal indicates the idle state except when both of the first command and the second command are being executed in parallel.

18. The memory system of claim 16, wherein the ready/busy signal indicates the busy state except when neither the first command nor the second command is being executed.

19. The memory system of claim 16, wherein the ready/busy signal further indicates a first waveform when only the first command is being executed, and a second waveform when only the second command is being executed.

* * * * *